(12) United States Patent
Zong et al.

(10) Patent No.: US 8,437,480 B2
(45) Date of Patent: May 7, 2013

(54) ADAPTIVE LOUDNESS LEVELLING FOR DIGITAL AUDIO SIGNALS

(75) Inventors: Wenbo Zong, Singapore (SG); Sapna George, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 328 days.

(21) Appl. No.: 12/768,599

(22) Filed: Apr. 27, 2010

(65) Prior Publication Data
US 2011/0150242 A1 Jun. 23, 2011

Related U.S. Application Data

(60) Provisional application No. 61/287,642, filed on Dec. 17, 2009.

(51) Int. Cl.
*A61F 11/06* (2006.01)

(52) U.S. Cl.
USPC ..................... 381/71.11; 381/71.12

(58) Field of Classification Search .................. 381/68.3, 381/102, 131, 107, 321; 348/571, 572; 341/139, 341/155
See application file for complete search history.

(56) References Cited

U.S. PATENT DOCUMENTS

| | | | | |
|---|---|---|---|---|
| 6,476,745 B1 * | 11/2002 | Evans et al. | .................... | 341/139 |
| 2007/0075919 A1 * | 4/2007 | Breed | ............................... | 345/8 |
| 2008/0008323 A1 * | 1/2008 | Hilpert et al. | ..................... | 381/1 |
| 2008/0225175 A1 * | 9/2008 | Shyshkin et al. | ............. | 348/572 |
| 2011/0164855 A1 * | 7/2011 | Crockett et al. | ............. | 386/230 |
| 2011/0257982 A1 * | 10/2011 | Smithers | ...................... | 704/500 |

* cited by examiner

*Primary Examiner* — Fan Tsang
*Assistant Examiner* — Eugene Zhao
(74) *Attorney, Agent, or Firm* — Hogan Lovells US LLP

(57) ABSTRACT

A time-domain method of adaptively levelling the loudness of a digital audio signal is proposed. It selects a proper frequency weighting curve to relate the volume level to the human auditory system. The audio signal is segmented into frames of a suitable duration for content analysis. Each frame is classified to one of several predefined states and events of perceptual interest is detected. Four quantities are updated each frame according to the classified state and detected event to keep track of the signal. One quantity measures the long-term loudness and is the main criterion for state classification of a frame. The second quantity is the short-term loudness that is mainly used for deriving the target gain. The third quantity measures the low-level loudness when the signal is deemed to not contain important content, giving a reasonable estimate of noise floor. A fourth quantity measures the peak loudness level that is used to simulate the temporal masking effect. The target gain to maintain the audio signal to the desired loudness level is calculated by a volume leveller, regulated by a gain controller that simulates the temporal masking effect to get rid of unnecessary gain fluctuations, ensuring a pleasant sound.

20 Claims, 16 Drawing Sheets

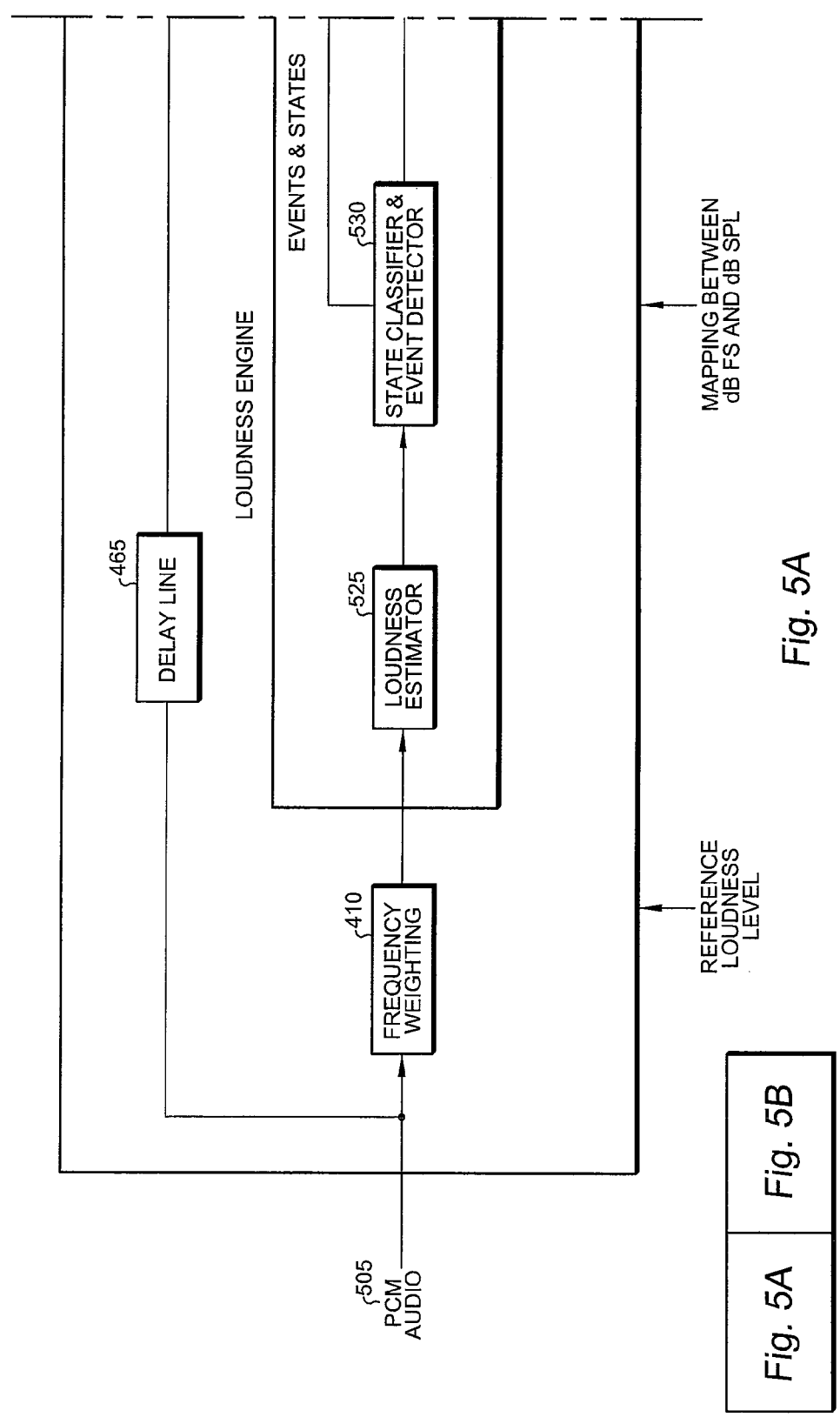

US 8,437,480 B2

ADAPTIVE LOUDNESS LEVELLING FOR DIGITAL AUDIO SIGNALS

RELATED APPLICATION

The present application relates to and claims the benefit of priority to U.S. Provisional Patent Application No. 61/287,642 filed Dec. 17, 2009 which is hereby incorporated by reference in its entirety for all purposes as if fully set forth herein.

BACKGROUND OF THE INVENTION

1. Field of the Invention

Embodiments of the present invention relate, in general, to audio signal processing, and more particularly to modifying the amplitude of a digital audio signal so that perceived loudness is maintained at a consistent level.

2. Relevant Background

Audio levels across varying signal sources vary. One particularly annoying feature of having access to multiple channels on television, thousands of songs from hundreds of artists on a single MP3 player, and multiple applications on mobile phones is that just as quickly as one can change from one audio signal source to another, so too does the volume level change. Indeed, as a television viewer changes from one channel to the next, (or even when the programming changes on the existing channel), the volume the viewer set previously can vastly change with no viewer input.

FIG. 1 is a graphical depiction of four input signals from four different television channels. The amplitude of the signals of each channel 110, 120, 130, 140 varies significantly. Thus a person changing from the first television channel 110 to the second television channel 120 would experience a significant increase in volume. If the individual adjusted the television to a normal audio level, upon changing the set to the third television channel 130 the audio would likely soften. In this environment (in which audio signals change along with input signals) viewers must manually modify the volume setting upon each input change to maintain a reasonable audio level.

Many attempts have been made to tackle the issue of varying volume across different content presented via a particular media player, e.g. volume variances in television programs. A simple approach known to one of reasonable skill in the art is to employ a Dynamic Range Compressor (DRC) to suppress excessively loud signals and boost soft ones. A slightly more advanced approach would be to divide the signal into a number of sub-bands and apply a DRC to each sub-band independently. This technique is commonly referred to as multi-band DRC (MDRC). However, without analyzing the content of the signal but simply responding to the signal level according to a predefined output-input relationship curve, whether the response is based on amplitude or power, tends to distort the signal and produce unrealistic sounds. For instance, the attack or initial portion of a signal is attenuated while the release or trailing portion of a signal is amplified. The result is a less pleasant listening experience.

Television programming is very diverse. It ranges from classical music and opera to rock concerts, from romantic movies to disaster and horror films, and from news commentary to sporting events, just to name a few. And interspersed throughout each of these programs are advertisements designed to capture attention and evoke an emotional response. Television advertisements, generally speaking, are louder than a news broadcast or a drama/romantic movie. Instead, they are akin to a sporting event or a disaster movie, with respect to the volume in which they are presented.

It is commonplace for individuals watching television or using similar media presentation devices to manually adjust the volume each time a new piece of content is presented. When watching television, people often experience a considerable increase in volume upon the initiation of a commercial driving them to reduce the volume to a more pleasant level. Then upon resumption of their chosen content the volume has to be increased. Similarly when using a MP3 player, changing artists or shifting from one genre to another, one can experience dramatic volume changes. There is a long felt need for a system and/or methodology to eliminate this annoying experience by measuring and analyzing an audio signal so that a perceived loudness can be maintained at a substantially constant level. These and other challenges of the prior art are addressed by one or more embodiments of the present invention.

SUMMARY OF THE INVENTION

The present invention relates to a method and apparatus for weighting frequencies according to human listening sensitivity, measuring signal power at different rates, classifying a signal into a select plurality of states, detecting important events in a signal content, deriving an appropriate gain according to signal state and event, and finally applying the gain with proper smoothing to produce a pleasantly consistent volume experience to an end user.

According to one embodiment of the present invention, a digital audio signal is processed by a loudness leveller prior to being converted to an analog signal by a digital-to-analog (DAC) converter and amplifier for playback. The loudness leveller typically constitutes one block in an audio processing chain including decoding, Pulse-Code Modulation processing, loudness levelling and DAC conversion. Recall that Pulse-Code Modulation (PCM) is a digital representation of an analog signal where the magnitude of the signal is sampled regularly at uniform intervals, then quantized to a series of symbols in a numeric (usually binary) code. In other embodiments of the present invention, the loudness leveller can be placed earlier in the chain so long as the processing blocks following it do not change the volume significantly or adaptively.

One aspect of the present invention comprises a frequency weighting block and a loudness engine. The frequency weighting block models the human auditory system that has varying sensitivity to different frequencies. The loudness engine further includes a loudness estimator, a state classifier and event detector, an event handler, a volume leveller and a gain controller. Each of these components works in conjunction with each of the other components to manage the loudness of the audio signal. The loudness estimator determines the loudness of the current frame of an audio signal while the state classifier and event detector analyze the audio signal for perceptually important content. The event handler updates quantities that are used to track the audio signal and the volume leveller computes the target gain required to bring the current content to the desired loudness level. This target gain is passed to the gain controller, which ensures there is no excessive change in the target gain unless necessary to ensure a pleasant and smooth output.

The features and advantages described in this disclosure and in the following detailed description are not all-inclusive. Many additional features and advantages will be apparent to one of ordinary skill in the relevant art in view of the drawings, specification, and claims hereof. Moreover, it should be noted that the language used in the specification has been principally selected for readability and instructional purposes and may not have been selected to delineate or circumscribe the inventive subject matter; reference to the claims is necessary to determine such inventive subject matter.

BRIEF DESCRIPTION OF THE DRAWINGS

The aforementioned and other features and objects of the present invention and the manner of attaining them will become more apparent, and the invention itself will be best understood, by reference to the following description of one or more embodiments taken in conjunction with the accompanying drawings, wherein.

Figure 1:
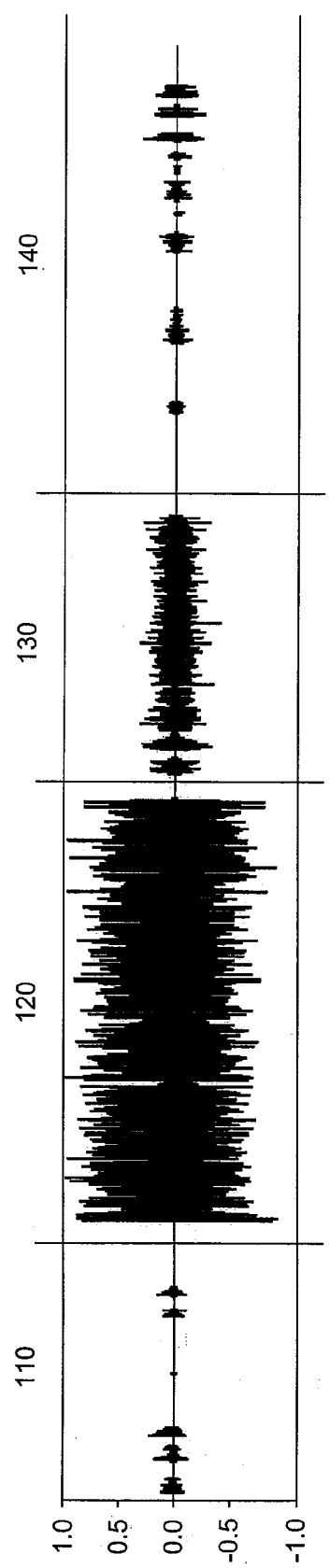
FIG. 1 depicts a typical varied auditory output of several channels of television signals as known in the prior art and applicable to one or more embodiments of the present invention.

The Figures depict embodiments of the present invention for purposes of illustration only. One skilled in the art will readily recognize from the following discussion that alternative embodiments of the structures and methods illustrated herein may be employed without departing from the principles of the invention described herein.

DESCRIPTION OF THE INVENTION

Embodiments of the present invention are hereafter described in detail with reference to the accompanying Figures. Although the invention has been described and illustrated with a certain degree of particularity, it is understood that the present disclosure has been made only by way of example and that numerous changes in the combination and arrangement of parts can be resorted to by those skilled in the art without departing from the spirit and scope of the invention.

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Disclosed hereafter by way of example is a loudness levelling method and associated apparatus. Embodiments of the present invention analyze the content of an audio signal by segmenting the signal into frames of a predefined duration. Each frame is classified into one of several predefined states and events of perceptual interest or detected change in content. Four quantities are identified and updated for each frame according to the frame's classified state and any detected events. One such quantity measures the long-term loudness of the signal. Using this quantity the frame's state is classified. A second quantity is referred to herein as the short-term loudness. This quantity is generally used to derive a target gain. Low-level loudness is the third quantity and is the portion of the signal deemed not to contain important content forming a reasonable noise floor. Lastly a peak loudness level is measured as the fourth quantity. The peak loudness level is used to simulate temporal masking. Temporal masking occurs when a sudden stimulus sound makes inaudible other sounds which are present immediately preceding or following the stimulus. Temporal masking's effectiveness attenuates exponentially from the onset and offset of the masker, with the onset attenuation lasting approximately 20 ms and the offset attenuation lasting approximately 100 ms.

A frequency weighting curve is selected to relate the volume level to the human auditory system. A target gain is determined to maintain the audio signal to a desired loudness level and regulated by a gain controller simulating temporal masking so as to reduce unnecessary fluctuations and ensure a pleasant sound for the listener.

Figure 2:
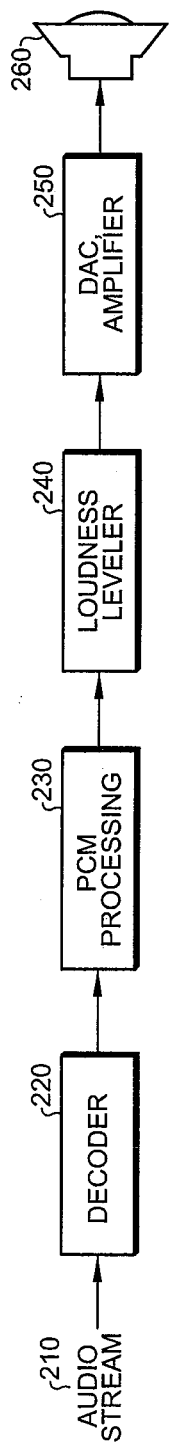
FIG. 2 shows a high-level block diagram of one embodiment of the present invention.

FIG. 2 shows a high level block diagram for adaptive loudness levelling. At the highest level an audio stream or signal 210 is received and decoded by a decoder 220. Thereafter, pulse-code modulation processing occurs forming a digital representation of the received auditory (analog) signal. As is well known, PCM processing 230 affixes digital value as a magnitude by regularly sampling the signal at uniform intervals. These magnitudes are then quantized to a series of symbols in a numeric (usually binary) code.

Once quantized, the signal is analyzed and modified by the loudness leveller 240. The leveled signal is converted back to analog form by a Digital-to-Analog converter 250 and delivered to a speaker 260 for presentation to the listener.

Figure 3:
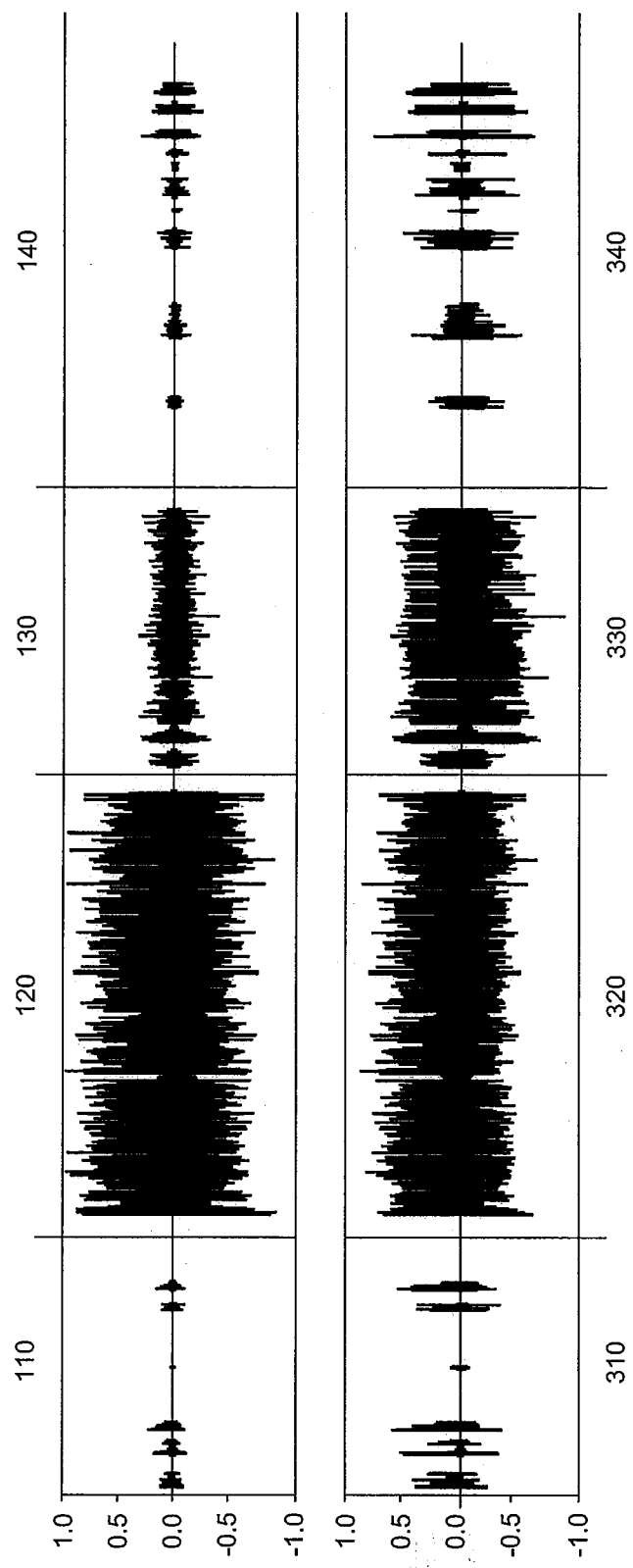
FIG. 3 shows a comparison of the typical varied auditory output of several channels of television as shown in FIG. 1 with that of the modified and substantially consistent auditory output according to one embodiment of the present invention.

An illustrative effect of the present invention is presented in FIG. 3. FIG. 3 shows a side by side comparison of the four audio signals first presented in FIG. 1 as modified by the adaptive loudness leveller of the present invention. As was previously described with reference to FIG. 1, audio signals often possess different levels of amplitude (loudness). FIG. 1 depicts an audio signal from four different television channels, 110, 120, 130, 140. As is clearly evident, the average amplitude of each of the signals varies significantly. For example, the first signal 110 depicts a relatively low amplitude conversation while the second signal 120 shows a much higher amplitude audio signal, perhaps associated with a sporting event.

When a viewer switches from the quieter signal 110 to the louder signal 120, the volume increase would be significant causing the viewer to likely manually adjust the volume so as to maintain a pleasant auditory experience. The present invention addresses this increase by analyzing the content of the signal and adjusting the gain to provide a more consistent listening environment without altering the quality of the audio signal.

FIG. 3 illustrates the same signals shown in FIG. 1 after they have been levelled by adaptive loudness levelling. A comparison of the levelled signals 310, 320, 330, 340 to the original signals 110, 120, 130 140 shows that the quality of the signals remains intact. That is the structure of the signal, local peaks and valleys, pauses and so forth, are maintained while the overall amplitude of the signal is modified. The amplitude of the first signal 310 is increased while that of the second signal 320 is decreased. Similarly the amplitude of the third 330 and forth 340 signals are also increased relative to the original signals 130, 140. While some variances in the overall loudness of the particular signals does occur, the large difference between the overall loudness of each channel (signal) is diminished.

Adaptive loudness levelling, while presented herein mainly with respect to a single channel or signal, is equally adept for application to a plurality of channels simultaneously. In one embodiment of the present invention, the loudness levelling method can analyze and level an arbitrary number of channels. While the number of channels that can be levelled is theoretically unlimited, in most of today's applications 7 main channels plus 1 subwoofer appear to be the most complicated scenario. Each channel can be processed independently or jointly wherein jointly or discretely processing each is associated with advantages and disadvantages. Levelling the loudness of each channel separately allows fine control per channel, but possesses the risk of changing the balance between channels and consuming slightly more computation resources. The opposite is true for levelling the loudness of all channels jointly. Joint processing maintains the balance and is computationally efficient but reduces the ability for fine modifications. Nonetheless, the core concept of the present invention for adaptive loudness levelling remains the same.

Figure 4:
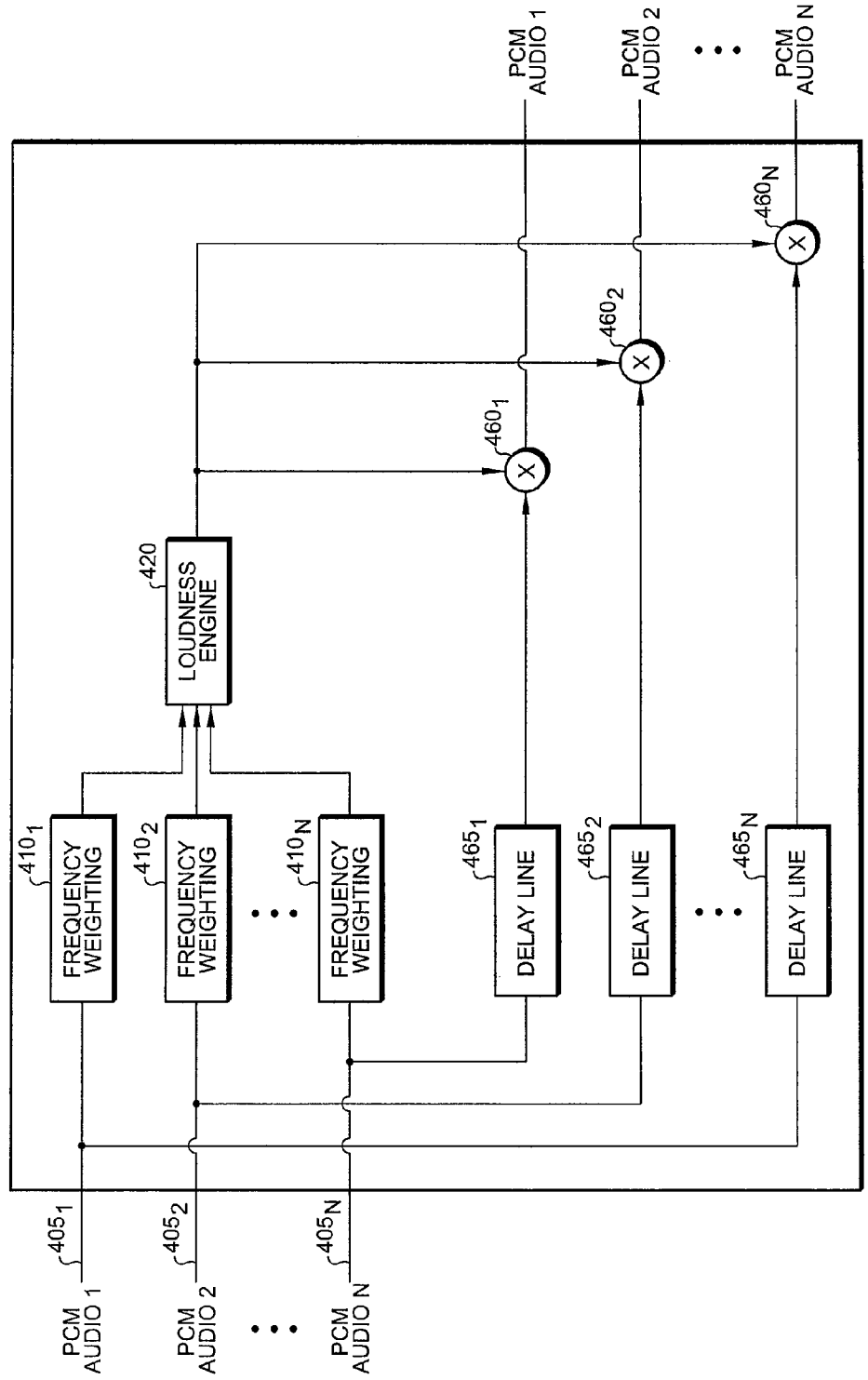
FIG. 4 illustrates a configuration embodiment of the present invention when used to process multiple audio channels simultaneously.

The ability for adaptive loudness levelling to scale to multiple signals simultaneously is shown in FIG. 4. In this exemplary depiction, three PCM audio signals $405_1, 405_2, 405_n$ are presented to the loudness leveller 400 simultaneously. The frequency of each signal is weighted $410_1, 410_2, 410_n$ and thereafter directed to the loudness engine 420 for analysis. At the same time a delay line $465_1, 465_2, 465_n$ carries the original signal $405_1, 405_2, 405_n$ to the combiner $460_1, 460_2, 460_n$ where a gain determined by the loudness engine is applied.

Figure 5B:
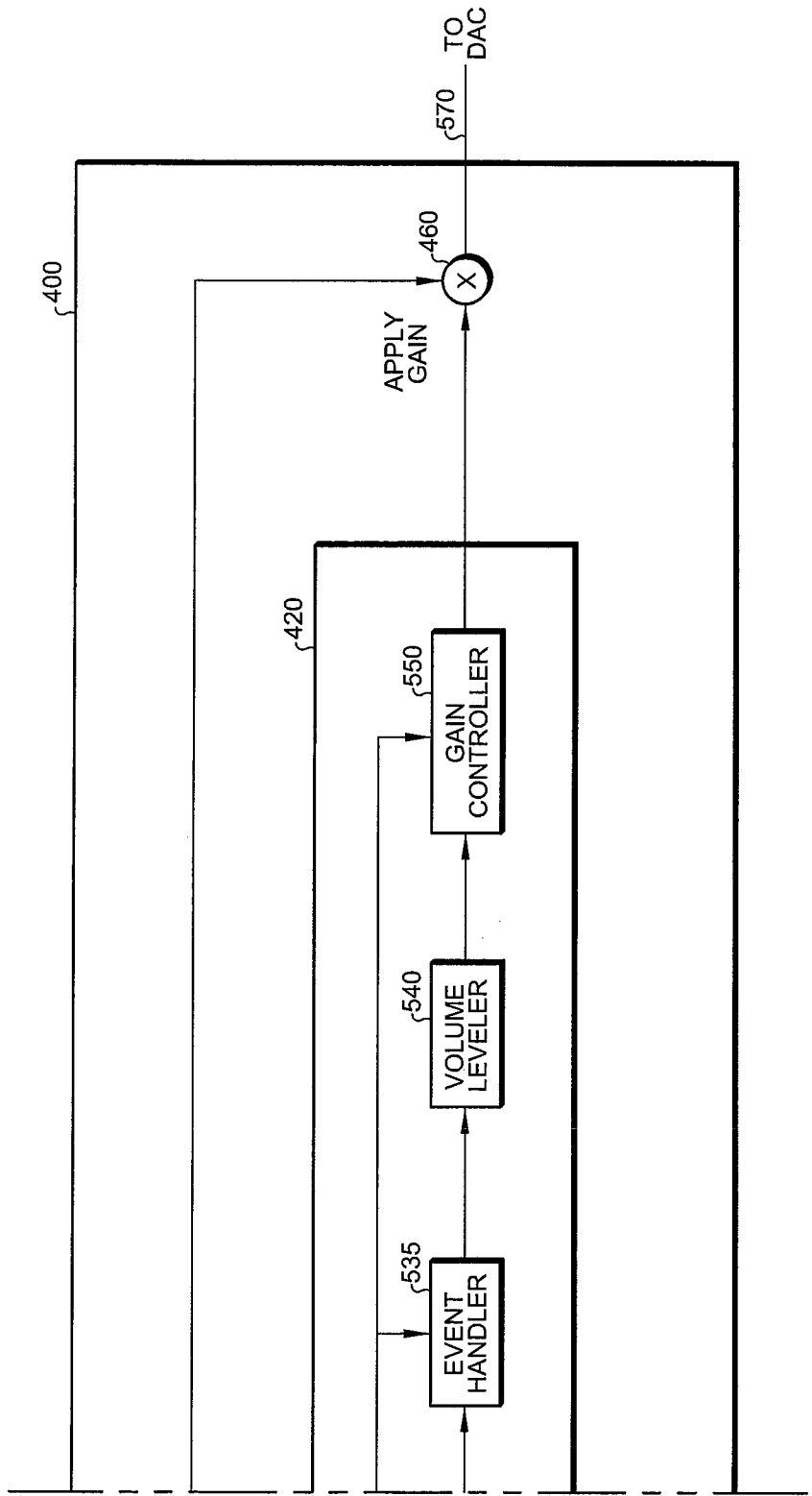
FIG. 5 is a high level diagram of a loudness leveller including a loudness engine according to one embodiment of the present invention.

FIG. 5 presents a high level block diagram of a loudness leveller 400 including a loudness engine according to one embodiment of the present invention. As is shown, the loudness leveller 400 includes a frequency weighting module 410, a loudness engine 420 and a delay line 465. A signal arriving post PCM processing 505 is split between the loudness engine 420 and the delay line 465 to be combined by the application of a particular gain 460 prior to leaving the loudness leveller 400. Thereafter the modified signal is delivered 570 to the digital-to-analog converter and amplifier.

Frequency Weighting

Figure 6:
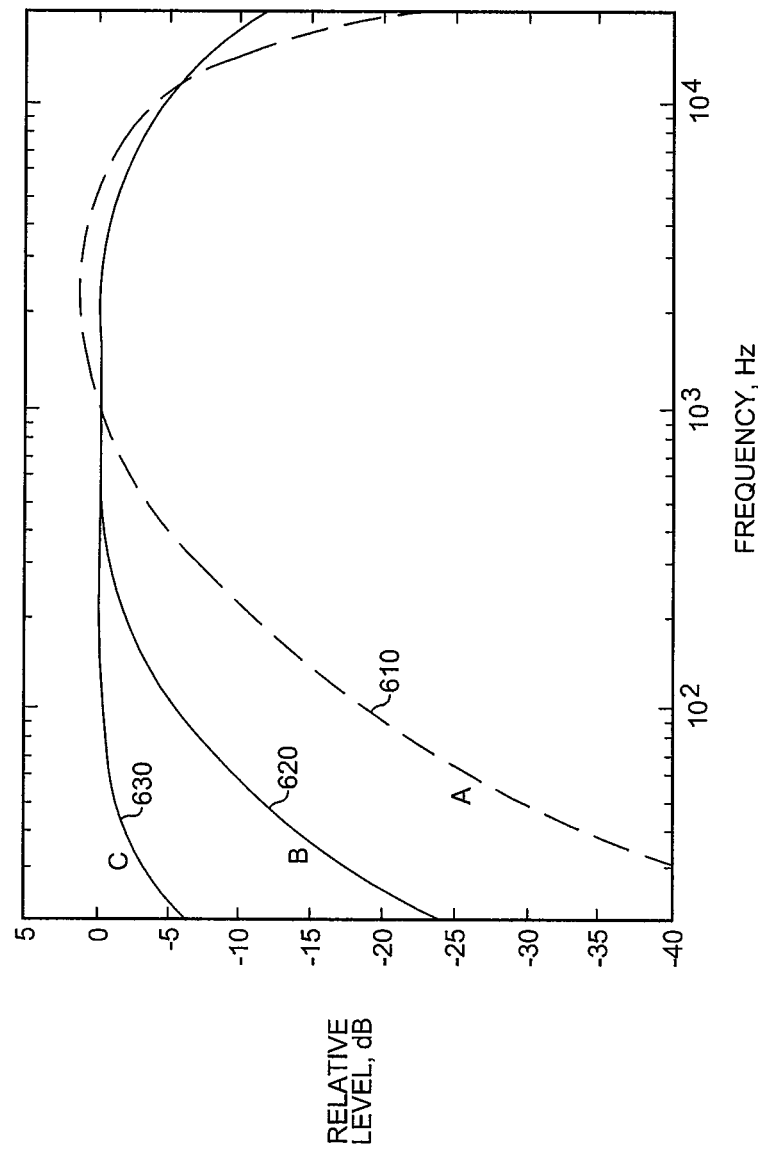
FIG. 6 is a graphical depiction of three weighting curves according to one embodiment of the present invention.

The first step in the levelling process is frequency weighting 410. Frequency weighting 410 accounts for the human hearing system being more sensitive to some frequencies than others. Weighting also accounts for the hearing system's frequency response variance for a variety of sound levels. An equal-loudness contour is a measure of sound pressure over the frequency spectrum for which the listener perceives as equally loud when presented with pure steady tones. To achieve a consistent loudness, it is therefore necessary to compensate the sensitivity difference of the human hearing system by applying an inversed weighting curve to the source signal. FIG. 6 depicts several frequency weighting curves for use in an adaptive loudness leveller. Each curve presents what would be perceived as a constant loudness for human hearing. Thus even though the actual loudness of the signal measured in dB varies, the human ear would perceive a signal along one of these curves as being equally loud. Three curves are shown in FIG. 6, however, one of reasonable skill in the art would recognize that other curves can be implemented with the present invention without departing from the invention's scope. A first curve is an A-weighting curve 610 that approximates the 40-phon equal loudness contour. Second is a B-weighting curve 620 that approximates the 70-phon contour, and next a C-weighting curve 630 that approximates the 100-phon contour.

In one embodiment of the present invention, the frequency weighting curve 610, 620, 630 can be related to the desired loudness level. For example, if the desired loudness level is 80 dB SPL (sound pressure level), then the frequency weighting curve corresponding to an equal loudness curve of 80-phon at 1 KHz can be used. Various frequency weighting curves can be utilized during implementation of the present invention.

Loudness Estimation

Referring again to FIG. 5, the loudness engine 420 is shown to comprise a loudness estimator 525 coupled to a frequency weighting module 410. According to one embodiment of the present invention, the loudness estimator 525 is fed with a block of samples, typically of about 5 milliseconds duration. One skilled in the art will recognize that the duration of the block of samples can vary. The duration of the block is selected to optimize estimation while not evoking a large delay. A small block of samples often results in unreliable estimation and a large block incurs too much delay. The loudness estimator can, according to one embodiment, give priority to samples of higher amplitude than the ones of lower amplitude in imitation of the human auditory system, which has a temporal masking effect. One way to implement such a loudness estimator is to use a first-order infinite impulse response (IIR) filter to compute a running average of the squared samples, with two different decaying factors. Such a filter can be expressed as:

If $|x[n]|>p[n-1]$ $$p[n]=C\_fast \cdot p[n-1]+(1-C\_fast) \cdot |x[n]|^2,$$

else $$p[n]=C\_slow \cdot p[n-1]+(1-C\_slow) \cdot |x[n]|^2,$$

where p is the estimated power array, x the input samples, C_fast and C_slow the fast and slow decaying factors, respectively.

A typical value of C_fast would correspond to an attack time of 5 milliseconds and that of C_slow to a release time of 100 milliseconds. The maximum of the power array p[n] can be chosen as the estimated loudness of the block, converted to decibel, denoted as InputdB:

$$\text{InputdB}=10 \cdot \log_{10}(\max(p[n])).$$

This again favors samples of large amplitude, for reasons mentioned above. InputdB will be used for further processing as described below.

When there are multiple channels, the loudness estimator can take a weighted average of the squared signal or simply take the maximum of the squared signal for the computation of the power array p, where the latter favours the loudest channel. Alternatively, if discrete channel control is desired, the whole process can be applied to each channel independently. With the loudness of the signal estimated, the content can be analyzed to characterize the state of the data.

State Classifier and Event Detector

For each block of data, a state classifier and event detector 530 classifies the data into one of four states. These states include STATE_ATTACK, STATE_RELEASE, STATE_STEADY, and STATE_SILENCE. The classification of the data into one of these four states is based on an estimated long-term loudness measure (denoted as LTLdndB hereafter) and a plurality of predefined constant values. Each state denotes a particular condition characteristic of a type of listening environment. STATE_ATTACK is characterized by the data block possessing high loudness level with a high probability of increasing loudness. STATE_RELEASE represents a data block of a low loudness level that is probably decreasing in loudness. When the data block's loudness is neither high or low and may be in a transition state it is classified as STATE_STEADY. Finally STATE_SILENCE refers to a data block comprised of no substantial content and is likely just noise.

The state classifier and event detector 530 also examines the content for one of two event conditions: EVENT_ATTACK and EVENT_SILENCE. EVENT_ATTACK occurs when the signal is believed highly likely to contain important content. This is in contrast to a single frame being classified as STATE_ATTACK, which could be due to short-lived noise.

EVENT_SILENCE on the other hand is characterized as a signal having extremely low power for a long interval. It is highly likely that there is no real content at all in this period of time. This is in contrast to the transient silence, STATE_SILENCE, that often exists between voices, such as a pause of speech.

Figure 7A:
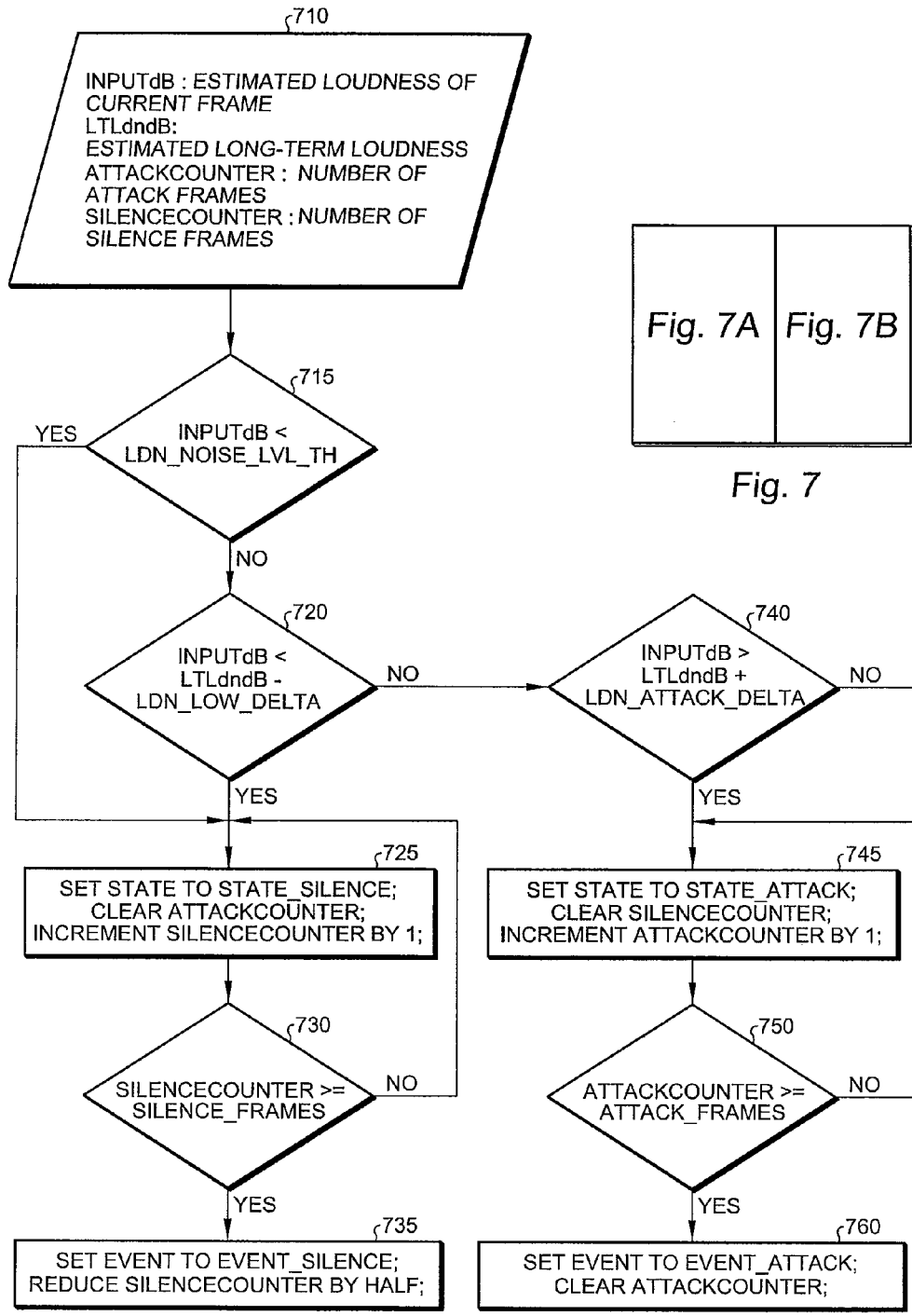
FIG. 7 is a flowchart showing one embodiment of processing logic of a state classifier and event detector according to the present invention.
Figure 7B:
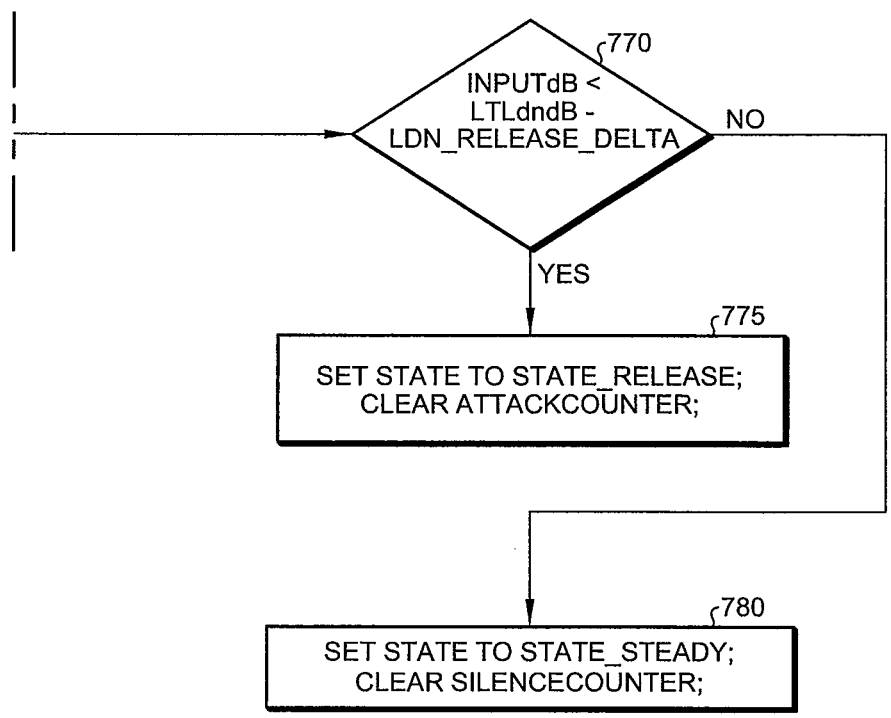

FIG. 7 is a flowchart showing one embodiment of processing logic of a state classifier and event detector according to the present invention. The flowcharts included in this description present examples of the methodology which may be used for adaptive loudness levelling. In the following description, it will be understood that each block of the flowchart illustrations, and combinations of blocks in the flowchart illustrations, can be implemented by computer program instructions. These computer program instructions may be loaded onto a computer or other programmable apparatus to produce a machine such that the instructions that execute on the computer or other programmable apparatus create means for implementing the functions specified in the flowchart block or blocks. These computer program instructions may also be stored in a computer-readable memory that can direct a computer or other programmable apparatus to function in a particular manner such that the instructions stored in the computer-readable memory produce an article of manufacture including instruction means that implement the function specified in the flowchart block or blocks. The computer program instructions may also be loaded onto a computer or other programmable apparatus to cause a series of operational steps to be performed in the computer or on the other programmable apparatus to produce a computer implemented process such that the instructions that execute on the computer or other programmable apparatus provide steps for implementing the functions specified in the flowchart block or blocks.

Accordingly, blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems that perform the specified functions or steps, or combinations of special purpose hardware and computer instructions.

Turning to FIG. 7, the state and event classification process begins 710 with the inclusion of InputdB or the estimated loudness of the block, converted to decibels. Along with InputdB, the state and event classifier 530 receives the estimated loudness of the current frame, the long term loudness level, an attack counter representing the number of frames that have been designated as attack frames, and a silence counter representative of the number of frames that are deemed silence frames.

An initial query 715 is conducted to determine whether InputdB is less than the absolute threshold below which the signal is considered noise, LDN_NOISE_LVL_TH, e.g. −70 dB FS. When the answer is no, a second query 720 is conducted to determine whether InputdB is less than the difference between the long term loudness level, LTLdndB, and a relative threshold, LDN_LOW_DELTA, below which the signal is once again considered as noise, e.g. 30 dB. Upon the affirmation that the signal is noise, the state is set 725 to a STATE_SILENCE with the attack counter cleared and the silence counter incremented by one.

From that point the silence counter is compared to the number of SILENCE_FRAMES. When the silence counter number is greater than or equal to the number of SILENCE_FRAMES, a silence event, EVENT_SILENCE, is declared 735. At this point the silence counter is reduced by half.

When InputdB is found to not be of such a low level as to constitute noise, the loudness level of the input, InputdB, is compared 740 to the combination of the long term loudness level, LTLdndB, and a relative threshold with respect to LTLdndB above which the signal is considered as an attack frame called LDN_ATTACK_DELTA. Typically a 3 dB relative threshold is indicative of an attack condition. Of course one skilled in the art will recognize that these predetermined levels can change depending on the implementation scenario in which the invention is utilized. When the input signal exceeds this relative threshold, an attack state, STATE_ATTACK, is set 745, the silence counter is cleared and the attack counter is incremented by one. If the attack counter is greater than or equal to the number of attack frames 750, ATTACK_FRAMES, an attack event, EVENT_ATTACK, is declared 760.

When the inquiry 740 whether the InputdB is sufficient to be classified as a state of attack is negative, a follow-up question is asked to determine whether a state of release exists 770. A state of release is declared when the InputdB is less than the difference between the long term loudness level, LTLdndB, and the loudness release delta, LDN_RELEASE_DELTA. If InputdB is, in one embodiment, 3 dB below LTLdndB, the signal is considered as a release frame. In such a situation a silence state is declared 775, STATE_SILENCE, and the attack counter is cleared.

When InputdB is greater than or equal to the difference between the long term loudness level, LTLdndB, and the loudness release delta, LDN_RELEASE_DELTA, the frames are considered 780 in a steady state, STATE_STEADY. The silence counter is thereafter cleared.

Note that the number of silence frames, SILENCE_FRAMES, is the number of accumulated STATE_SILENCE frames above which the signal is considered as being silent and hence triggers an EVENT_SILENCE to be set, typically corresponding to a duration of 2 seconds.

Attack frame, ATTACK_FRAMES, on the other hand, is the number of accumulated STATE_ATTACK frames above which the signal is considered as the onset of loud content and hence triggers EVENT_ATTACK to be set, typically corresponding to a duration of 15 milliseconds.

Event Handler

According to one embodiment of the present invention, a few quantities are used to keep track of the signal and are updated each frame. How these quantities are updated depends on the state and event detected. This update process is accomplished by the event handler 535. When there is a new occurrence of perceptual interest, such as an onset of a loud sound, the concerned quantities are updated faster so as to adapt to the signal quickly. According to one embodiment, four quantities are examined to keep track of the signal. They are defined as:

LTLdndB: As previously described this is the long-term loudness of the signal and it is updated at a constant rate in the order of seconds (e.g. 2 seconds).

STLdndB: The short-term loudness of the signal is updated based on the state and/or event. This may occur at a much higher rate on the order of hundreds of milliseconds (e.g. 500 milliseconds) or in the order of seconds (e.g. 3 seconds).

LowSigLdndB: Low signal loudness is the long-term loudness when the signal level is very low. This quantity provides a gauge of the noise floor of the signal. It is updated at a constant rate in the order of seconds (e.g. 2 seconds).

PeakdB: Peak loudness is the loudness recently present in the signal and is used for simulating the temporal masking effect. Peak loudness is updated at a constant rate in the order of seconds (e.g. 1.5 seconds).

Figure 8A:
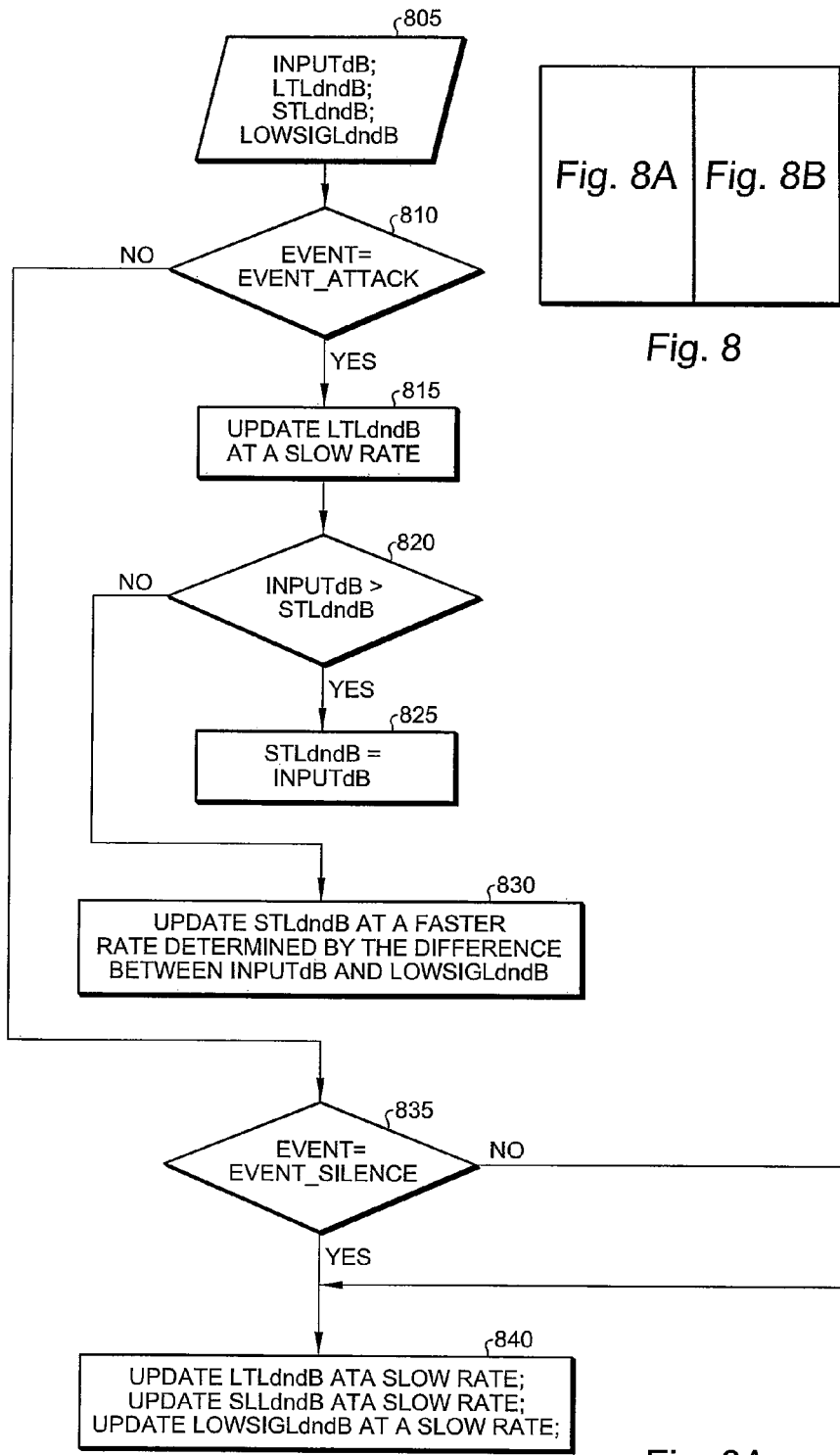
FIG. 8 is a flowchart showing one embodiment of processing logic of an event handler according to the present invention.
Figure 8B:
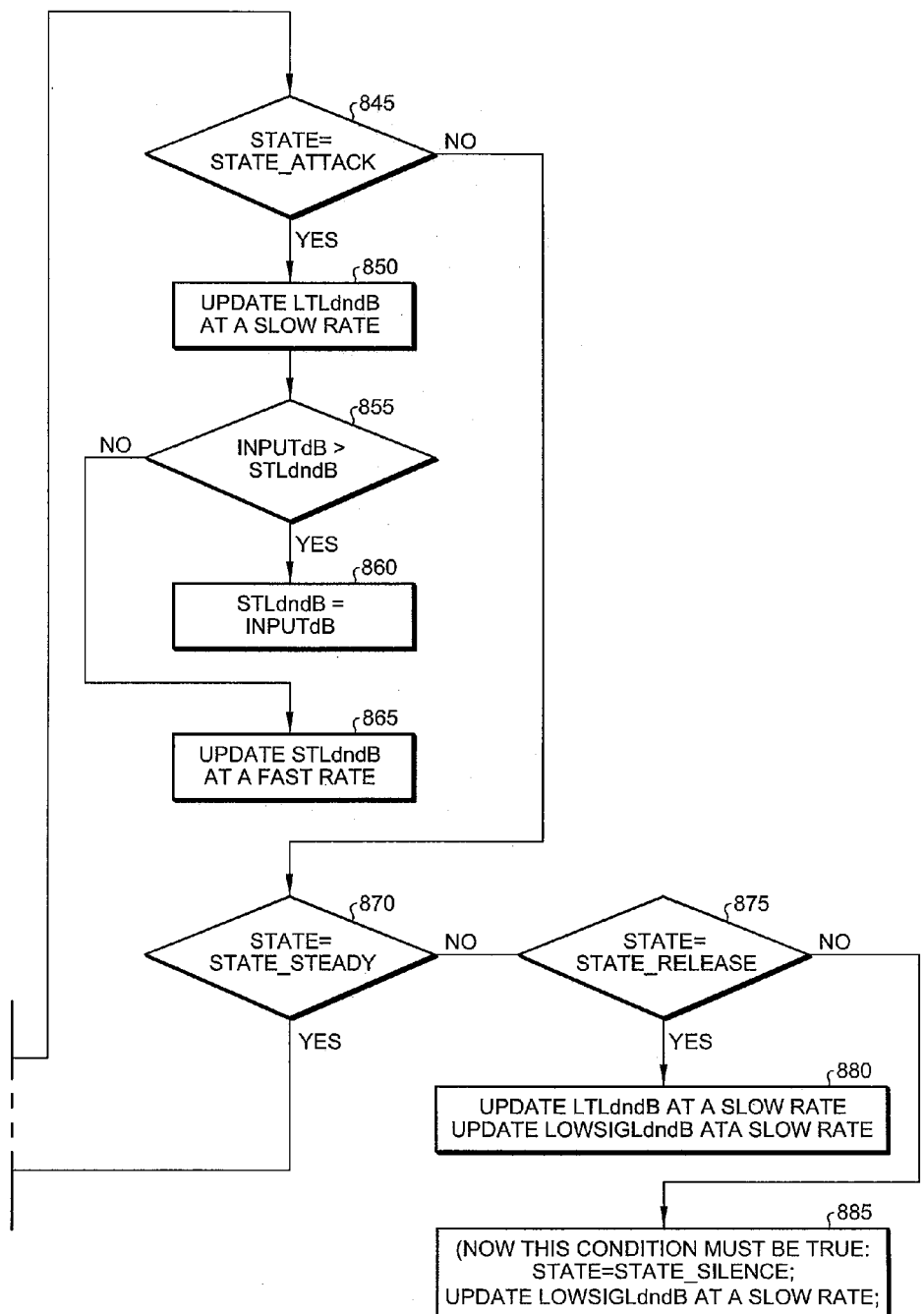

FIG. 8 is a flowchart showing one embodiment of processing logic of an event handler according to the present invention. This flowchart shows how the first three quantities (LTLdndB, STLdndB, and LowSigLdndB) are updated under each event or state. Generally speaking, an event is more significant than a state, as evidenced in the flowchart. In most cases, the updating rate for a particular quantity is pre-determined based on a specific configuration of the proposed method. However, in the case of an attack event, EVENT_ATTACK, the updating rate for SLLdndB is determined based on latest content gathered about the signal. This occurs because when the signal has a long period of silence (or very low level content) preceding the current frame, it is likely that this frame is the onset of a loud sound and hence it is necessary to adapt as quickly as possible. From the human perception point of view, the old content would have been almost forgotten and thus has less impact on the perception of the new content. In one embodiment of the present method of adaptive loudness levelling, SLLdndB can be updated with a first-order IIR filter that provides the necessary smoothing. Thus SLLdndB can be expressed as:

$$SLLdndB = decay\_rate \cdot SLLdndB + (1 - decay\_rate) \cdot InputdB$$

Figure 9:
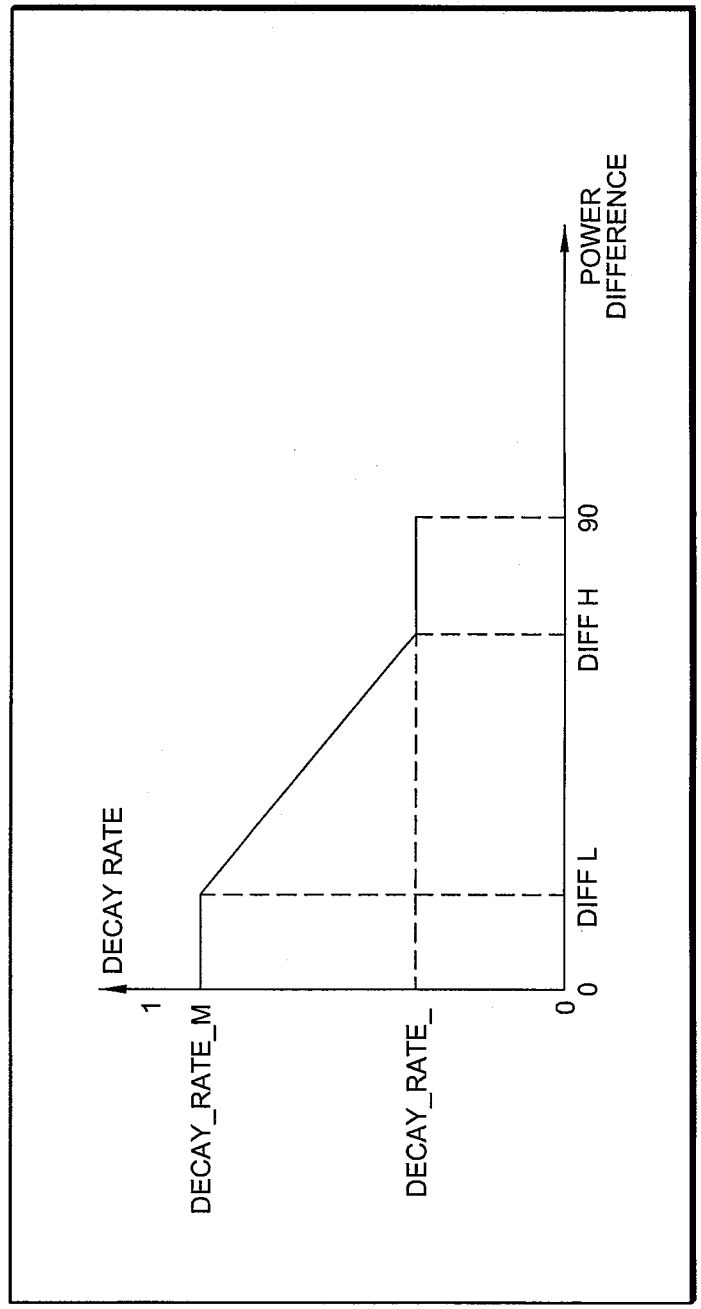
FIG. 9 shows one embodiment of a curve used to compute the decay rate when updating the short-term loudness according to the present invention.

To take into account the context of the event, the decay rate, decay_rate, can be determined according to the difference between InputdB and LowSigLdndB (i.e. InputdB−LowSigLdndB). This relationship is shown in the curve depicted in FIG. 9. FIG. 9 shows a curve used to compute the decay rate when updating the short-term loudness according to the present invention. Exemplary values for the boundary condition thresholds DIFF_L, DIFF_H, DECAY_RATE_MIN and DECAY_RATE_MAX are 15, 55, 0.2 and 0.977, respectively.

Turning back to FIG. 8, the process logic begins 805 with the four values stated above. These values include InputdB, LTLdndB, STLdndB, and LowSigLdndB. First, an initial inquiry is made to determine whether 810 an attack event exists, event=EVENT_ATTACK. If the determination is affirmative, the long term loudness of the signal, LTLdndB, is updated at a slow rate. As one of reasonable skill can appreciate, the rates at which the updates occur as described with respect to FIG. 8 can vary without detrimentally impacting the effectiveness and usefulness of the present invention. Indeed, the ability for these rates to adjust to multiple implementation scenarios serves as evidence of the invention's wide breadth of applicability.

Once LTLdndB is updated, the input signal, InputdB, is compared 820 to the short term loudness level, STLdndB. When the input signal, InputdB, is greater than the short term loudness level, the short term loudness level is set equal 825 to the input signal. When the short term loudness level, STLdndB, is less than InputdB, the short term loudness level is updated at a faster rate 830 as determined by the difference between the input signal, InputdB, and the low signal loudness level, LowSigLdndB as illustrated in FIG. 9.

Referring back to the first query 810, when the Event is not equal to an attack event, the process continues to explore what sort of event has occurred. Accordingly the next query is whether the event is a silence event 835, event=EVENT_SILENCE. If a silence event is declared, several values are updated 840 at slow rates. These values include long term loudness level (LTLdndB), short term loudness level (STLdndB) and low signal loudness level (LowSigLdndB).

When the event handler 535 fails to classify the event as either an attack or silence, the handler asks 845 whether the state of the content is that of an attack, state=STATE_ATTACK. When the answer to that inquiry is no, a follow-up question is asked to determine whether 870 the state of the signal is steady state, state=STATE_STEADY. If it is determined that a steady state conditions exists LTLdndB, STLdndB and LowSigLdndB are updated at a slow rate 840.

When it is determined that the state of the signal is one of attack 845, the long term loudness level is updated at a slow rate 850 and the signal input, Inputdb, compared 855 to the short term loudness level, STLdndB. As before, if the input signal is greater than the short term loudness level, the short term loudness level is replaced 860 by the input signal, STLdndB=InputdB. Otherwise, the term loudness, STLdndB, is updated at a fast rate to respond quickly to any short term changes.

Lastly, when the state is neither one of attack nor steady, a last inquiry 875 is made to see if a release state exists, state=STATE_RELEASE. With a release state identified, the long term loudness level, LTLdndB, and the low signal loudness level, LowSigLdndB, are updated 880 at a slow rate. If a release state does not exist, the method defaults to a silence state 885, state=STATE_SILENCE, causing the low signal loudness level, LowSigLdndB, to be updated at a slow rate.

Volume Leveller

With additional reference again to FIG. 5, it can be seen that the output from the event handler 535 serves as the input to the volume leveller 540. The volume leveller 540 derives a target gain, denoted TargetGaindB, to be multiplied with the input signal 505 (after conversion to the linear domain) to maintain a consistent average loudness. The input to the volume leveller 540 is the short-term loudness, STLdndB, which is calculated by the event handler 535. In one embodiment of the present invention, the relationship between the target gain TargetGaindB and the estimated loudness STLdndB can follow a curve similar to that shown in FIG. 10.

Figure 10:
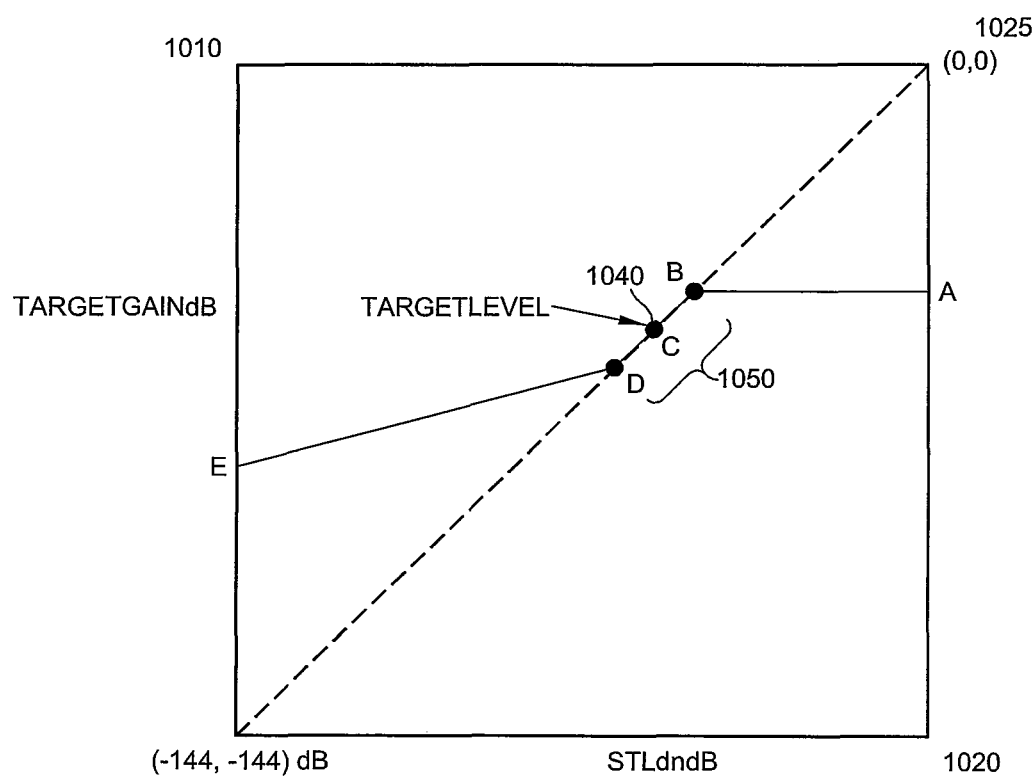
FIG. 10 depicts an example relationship between the target gain and the input loudness according to the present invention.

FIG. 10 depicts on the vertical axis 1010 the TargetGaindB and on the horizontal axis 1020 InputdB. Note that the origin of the graph 1025 is the upper right hand corner with the lower left corner representing a linear −144 dB drop in sound level.

The Target Level 1040, which is the mid-point of the linear segment 1050 of the curve between points B and D in FIG. 10, does not necessarily correspond to the desired loudness level. Rather, the Target Level 1040 can, according to one embodiment of the invention, be chosen to be close to the estimated mean volume level of audio sources to be processed. In a typical implementation of the current invention, for example a television, audio sources are very diversified and are often mastered at different reference audio levels. Therefore, they may have very different volume in the digital domain. In order to achieve the optimal performance of the present invention without added complexity of specifying a mapping from the dB FS domain to the dB SPL domain, the mean volume level of different audio sources can be used as the Target Level 1040 of the volume leveller. This level could be −20 dBFS, for example, depending on the actual application and audio sources. The difference between the Target Level 1040 and the desired level is compensated for later by the gain controller 550 (described later).

It is worth highlighting that the linear segment between points B and D in FIG. 10 usually has a small range approximating 3 dB. This range is sufficient to allow small variations in the input signal to pass through the volume leveller 540 without introducing unnecessary short-term waveform modulation.

Gain Controller

The final component of the loudness engine 420 is the gain controller 550. The gain derived by the volume leveller 540, TargetGaindB, is subject to the gain controller 550 to further ensure a smooth and pleasant alteration to the audio signal. It is important to recognize that the temporal masking effect has a great impact on how humans perceive a sound. Recall that temporal masking occurs when a sudden stimulus sound makes other sounds which are present immediately preceding (pre-masking) or following (post-masking) the stimulus, inaudible. Generally speaking, when there is a temporal masking effect in the original audio signal, it is preferred to retain the masking in the processed signal so that human perception remains the same. Thus the masking stimulus (i.e. the loud sound) is an important sound element in a particular interval and there is no compelling reason to alter the masked sound more than the stimulus itself. The post-masking in the time domain lasts approximately 200 milliseconds; however, from a practical point of view, a much longer masking time can be implemented according to one or more embodiments of the present invention to eliminate unnecessary gain fluctuations, thus better preserving the waveform.

Figure 11:
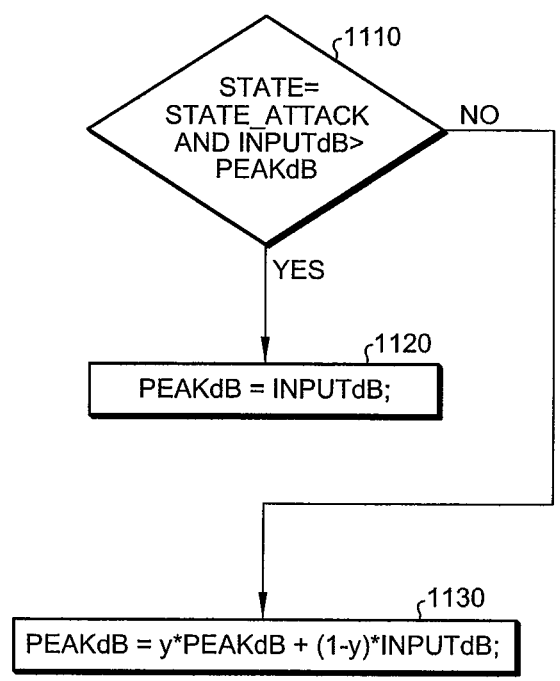
FIG. 11 is a flowchart showing one method embodiment of how a peak loudness level is updated according to the present invention.

In one embodiment of the present invention, three conditions are checked to simulate this temporal masking effect. The first condition is the peak signal level, PeakdB. This quantity is updated every frame. FIG. 11 is a flowchart of one method embodiment for updating PeakdB. As shown in FIG. 11, the precedence is given to a high power frame with γ being a smoothing rate in the order of seconds (e.g. 1.5 seconds). The process begins by determining 1110 whether an attack state exists as well as the InputdB being larger than the existing PeakdB. Recall that the volume leveller 540 supplies the gain controller 550 with InputdB and, as illustrated in FIG. 5, the gain controller 550 also receives an event/state classification from the state classifier 530. When it is determined that an attack state exists and that the InputdB is larger than the PeakdB, the PeakdB is replaced 1120 by the input signal, InputdB. When this is not the case the PeakdB is smoothed 1130 utilizing a smoothing rate.

The second condition that is checked to simulate this temporal masking effect requires the determination of the average loudness level of the several most recent frames, LastAvgdB. Typically the most recent 2 or 3 frames are used, assuming each frame is about 5 milliseconds in duration. Lastly, the third condition to simulate temporal masking is the state of the current frame given by the state classifier.

Figure 12:
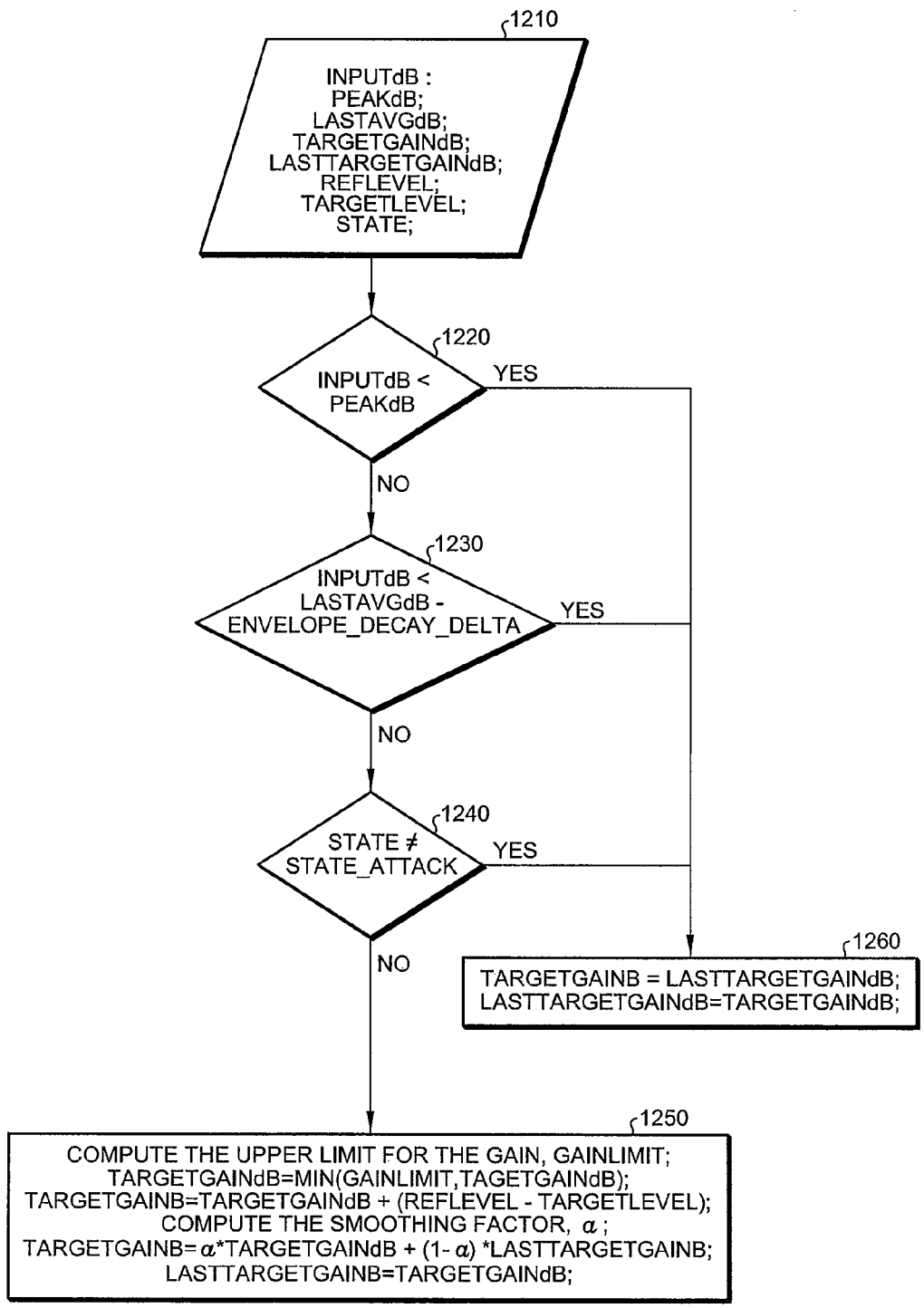
FIG. 12 is a flowchart showing one embodiment of processing logic of a gain controller according to the present invention.

FIG. 12 is a flowchart showing one embodiment of processing logic of the gain controller according to the present invention to manage the temporal masking effect.

The gain controller 550 receives 1210 a plurality of inputs including InputdB, PeakdB, LastAvgdB, TargetGaindB, LastTargetGaindB, RefLevel, TargetLevel, and State. The first inquiry is to determine 1220 whether InputdB is smaller than the PeakdB. When the signal input, InputdB, is less than the existing signal peak the targeted gain is equated to the last targeted gain value 1260.

If the peak signal value is less than the input, a query is made to see if the input signal, inputdB, is less than the difference between the last average signal value and an envelope decay delta, ENVELOPE_DECAY_DELTA 1230. The constant ENVELOPE_DECAY_DELTA determines the strength of the masking effect. A typical value for ENVELOPE_DECAY_DELTA would be 3 dB. When the input signal is less than this difference, the target gain is again equated to the last target gain value 1260. If not, it is asked to see if an attack state exists 1240. If such an attack state exists, the same target gain is set 1260. If the answer is no, new values for a target gain are computed 1250.

Figure 13:
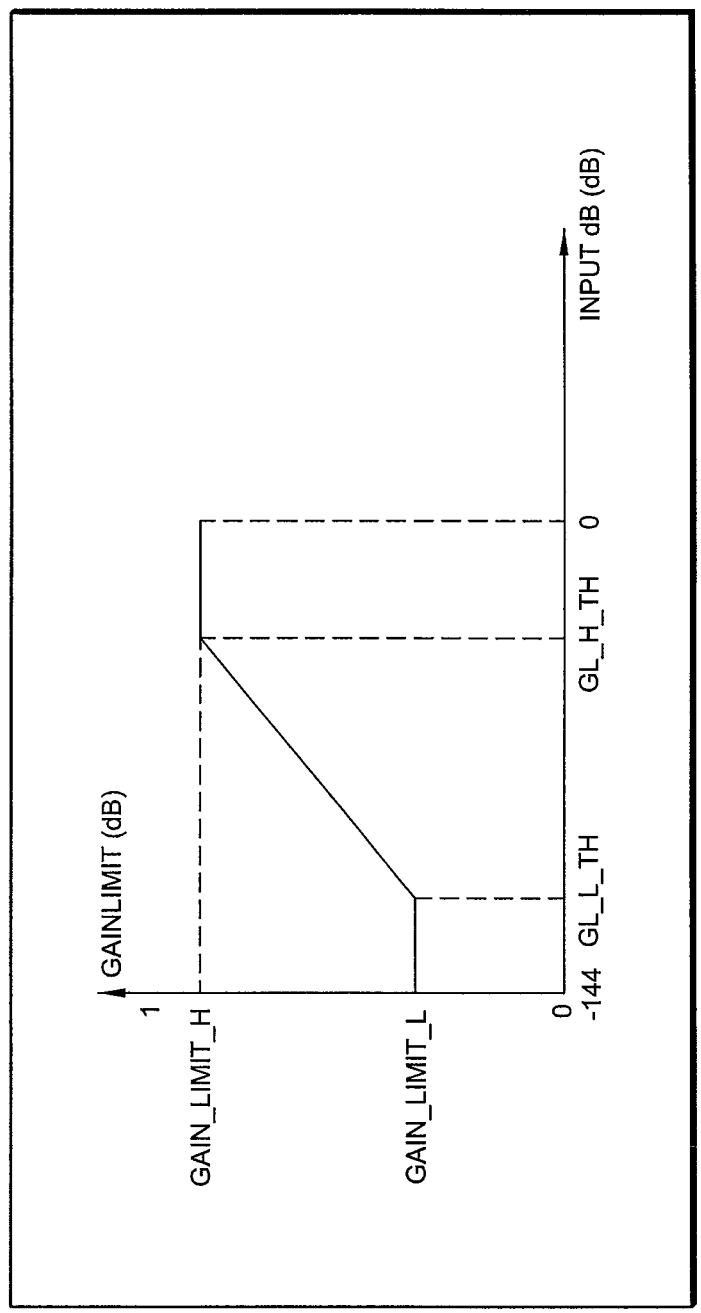
FIG. 13 depicts one embodiment of a curve for computing the limit for the target gain as related to the input loudness level according to the present invention.

The upper limit for the gain, GainLimit, ensures low level content is not excessively amplified. A greater GainLimit can be used when the current loudness is higher because it is more likely that the current frame contains important content, and vice versa. FIG. 13 shows one relationship between GainLimit and InputdB. Exemplary values of predefined constants GL_H_TH, GL_L_TH, GAIN_LIMIT_L and GAIN_LIMIT_H include −20, −40, 10, 20, respectively.

Recall that the volume leveller 540 is configured with the expected mean volume level, TargetLevel. The difference between TargetLevel and the actual desired level, RefLevel, is compensated according to the equation:

$$TargetGaindB = TargetGaindB + (RefLevel - TargetLevel).$$

Furthermore, to ensure that the target gains between successive frames do not change drastically, TargetGaindB is smoothed. One embodiment of the present invention makes the smoothing factor $\alpha$ proportional to the difference between the current loudness InputdB and last peak loudness PeakdB, i.e. (InputdB=PeakdB). This way, TargetGaindB is updated 'faster' when the current frame is louder (which indicates important content with higher likelihood), consistent with the main principles throughout this invention.

In one embodiment of the present invention, the actual gain to be applied can gradually approximate TargetGaindB on a sample by sample basis. For computation efficiency, TargetGaindB is first converted to the linear domain, denoted as TargetGain, and then the array of linear gains to be applied is produced, as expressed by:

$$g[n] = \beta \cdot g[n-1] + (1-\beta) \cdot TargetGain, \text{ for } 0 \leq n \leq N,$$

where $\beta$ is the smoothing factor that controls the updating rate (usually in the order of milliseconds), and the first element g[0] is the linear gain for the last sample of the preceding frame. Note that it is generally important to quickly reduce loudness rather than to boost loudness, therefore $\beta$ should be small when TargetGain is smaller than g[0], and vice versa.

Apply the Gain

The last step in the loudness leveller 400 is to apply the gain computed by the loudness engine 420 to the input signal 505 carried by the delay line 465. According to one embodiment of the present invention, the original input samples are temporarily stored in a delay line 465 to be delayed by a certain amount of time (equal to the computational time of frequency weighting 410 and the loudness engine 420) before multiplying with the computed linear gain. The delay time can be related to the rate of gain smoothing by the gain controller, and typically 10 milliseconds is found adequate.

Embodiments of the present invention propose methodology to maintain an audio signal (single or multiple channels) at a consistent loudness level. The application of proper frequency weighting ensures that the final output is directly related to human perception. Moreover, the analysis of the signal content ensures that different types of content are handled accordingly and the application of temporal masking ensures that the processed sound is smooth and pleasant to listen to. The effectiveness of the present invention is clearly illustrated in FIG. 3.

As will be understood by those familiar with the art, the invention may be embodied in other specific forms without departing from the spirit or essential characteristics thereof. Likewise, the particular naming and division of the modules, managers, functions, systems, engines, layers, features, attributes, methodologies, and other aspects are not mandatory or significant, and the mechanisms that implement the invention or its features may have different names, divisions, and/or formats. Furthermore, as will be apparent to one of ordinary skill in the relevant art, the modules, managers, functions, systems, engines, layers, features, attributes, methodologies, and other aspects of the invention can be implemented as software, hardware, firmware, or any combination of the three. Of course, wherever a component of the present invention is implemented as software, the component can be implemented as a script, as a standalone program, as part of a larger program, as a plurality of separate scripts and/or programs, as a statically or dynamically linked library, as a kernel loadable module, as a device driver, and/or in every and any other way known now or in the future to those of skill in the art of computer programming. Additionally, the present invention is in no way limited to implementation in any specific programming language, or for any specific operating system or environment. Accordingly, the disclosure of the present invention is intended to be illustrative, but not limiting, of the scope of the invention, which is set forth in the following claims.

While there have been described above the principles of the present invention in conjunction with adaptive loudness levelling, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features that are already known, per se, and which may be used instead of, or in addition to, features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserves the right to formulate new claims to such features and/or combinations of such features during the prosecution of the present application or of any further application derived therefrom.

We claim:

1. A method for adaptive loudness levelling, comprising:
receiving a plurality of audio input signals;
weighting one or more frequencies associated with each audio input signal according to human audio perception;
characterizing a state for each audio input signal;
detecting whether each audio input signal is experiencing an event;
producing a target levelling gain for each audio input signal based on the characterized state and/or detected event;
temporally masking the target levelling gain; and
combining the temporally masked target levelling gain with a delayed plurality of audio input signals.

2. The method of claim 1 wherein characterizing includes classifying each frame of the plurality of audio input signals according to a plurality of signal attributes.

3. The method of claim 2 wherein one of the plurality of signal attributes is an estimated long term loudness measure and wherein the estimated long term loudness measure is updated at a predetermined update rate.

4. The method of claim 3 wherein responsive to detecting that the plurality of audio input signals is experiencing an event, updating the plurality of signal attributes at an increased update rate greater than the predetermined update rate.

5. The method of claim 1 wherein temporally masking includes smoothing a peak signal level for each frame of the plurality of audio input signals.

6. The method of claim 1 wherein temporally masking includes smoothing an average loudness over a predetermined number of frames of the plurality of audio input signals.

7. The method of claim 1 wherein temporally masking includes smoothing each frame of the plurality of audio input signals based on content characterization.

8. The method of claim 1 further comprising smoothing the target levelling gain for each frame of the plurality of audio input signals proportionally to a difference between a current signal level and a prior peak signal level.

9. A method for modifying digital audio signal amplitude to maintain consistent loudness, comprising:
relating a volume level of a plurality of audio input signals to human perception using a weighting curve;
computing a volume levelling target gain by tracking a plurality of audio signal attributes for each of the audio input signals wherein tracking includes classifying a state of each of the audio input signals and detecting whether each of the audio input signals is associated with an event;
applying the volume levelling target gain to a delayed audio input signal producing a consistent loudness level; and
temporally masking the target levelling gain and combining the temporally masked target levelling gain with a delayed plurality of audio input signals.

10. The method of claim 9 further comprising segmenting each of the audio input signals into frames.

11. The method of claim 9 wherein the plurality of audio signal attributes includes a long-term loudness of the signal, a short-term loudness, a low-level loudness, and a peak loudness.

12. The method of claim 9 wherein a higher priority level is associated with a higher loudness estimate.

13. The method of claim 9 wherein the state of each of the audio input signals is primarily based on a long-term loudness attribute of the signal.

14. The method of claim 9 wherein detecting includes analyzing short-term loudness of each of the audio input signals.

15. The method of claim 9 wherein the volume levelling target gain is based on a short-term loudness level.

16. The method of claim 9 further comprising simulating temporal masking.

17. The method of claim 9 wherein the weighting curve is derived according to equal-loudness contour curves, the weighting curve being selected based on expected sound pressure levels.

18. The method of claim 9 wherein a short-term loudness level is updated based on the state and detected event and is used for computing the volume levelling target gain.

19. The method of claim 9 wherein the plurality of audio signal attributes are discriminatively updated based on event detection.

20. The method of claim 9 further comprising simulating a temporal masking effect of human hearing by tracking a peak loudness, an average loudness and the state of each of the plurality of audio input signals.

* * * * *